(12) United States Patent
Chen et al.

(10) Patent No.: US 8,163,093 B1
(45) Date of Patent: Apr. 24, 2012

(54) CLEANING OPERATIONS WITH DWELL TIME

(75) Inventors: Chaoyuan Chen, San Jose, CA (US);
Shaun Chen, Cupertino, CA (US)

(73) Assignee: WD Media, Inc., San Jose, CA (US)

(*) Notice: Subject to any disclaimer, the term of this patent is extended or adjusted under 35 U.S.C. 154(b) by 304 days.

(21) Appl. No.: 12/369,701

(22) Filed: Feb. 11, 2009

(51) Int. Cl.
B08B 3/12 (2006.01)

(52) U.S. Cl. ............................................. 134/1; 134/1.3

(58) Field of Classification Search ............... 134/1, 1.3, 134/42; 438/472
See application file for complete search history.

(56) References Cited

U.S. PATENT DOCUMENTS

| | | |
|---|---|---|
| 4,736,760 A | 4/1988 | Coberly et al. |
| 4,902,350 A | 2/1990 | Steck |
| 4,984,597 A | 1/1991 | McConnell et al. |
| 5,071,776 A * | 12/1991 | Matsushita et al. ........... 438/460 |
| 5,090,432 A | 2/1992 | Bran |
| 5,169,408 A | 12/1992 | Biggerstaff et al. |
| 5,301,701 A | 4/1994 | Nafziger |
| 5,317,778 A | 6/1994 | Kudo et al. |
| 5,593,505 A | 1/1997 | Erk et al. |
| 5,725,753 A | 3/1998 | Harada et al. |
| 5,727,578 A | 3/1998 | Matthews |
| 5,776,259 A | 7/1998 | Ciari |
| 5,849,104 A | 12/1998 | Mohindra et al. |
| 5,873,947 A | 2/1999 | Mohindra et al. |
| 5,881,748 A | 3/1999 | Suzuki |
| 5,911,837 A | 6/1999 | Matthews |
| 5,950,643 A | 9/1999 | Miyazaki et al. |
| 6,108,928 A | 8/2000 | Park et al. |
| 6,477,786 B1 | 11/2002 | Jones et al. |
| 6,575,177 B1 | 6/2003 | Brown et al. |
| 6,620,260 B2 | 9/2003 | Kumagai et al. |
| 6,625,901 B1 | 9/2003 | Mehmandoust et al. |
| 2001/0013355 A1 | 8/2001 | Busnaina |
| 2002/0139390 A1 | 10/2002 | Okano et al. |
| 2003/0234029 A1 | 12/2003 | Bergman |
| 2007/0175496 A1 | 8/2007 | Rattray |
| 2007/0181159 A1 | 8/2007 | Ibe et al. |
| 2008/0295860 A1 | 12/2008 | Burger |
| 2009/0165824 A1 * | 7/2009 | Sekiguchi et al. ............... 134/21 |

FOREIGN PATENT DOCUMENTS

WO 2008056969 A1 5/2008

OTHER PUBLICATIONS

U.S. Appl. No. 12/363,676, filed Jan. 30, 2009, 17 pages.
Office Action dated Mar. 3, 2011 in U.S. Appl. No. 12/363,676, 10 pages.
U.S. Office Action from U.S. Appl. No. 12/363,676 dated Aug. 12, 2011.
Office Action dated Dec. 14, 2011 in U.S. Appl. No. 12/363,676, 13 pages.
Office Action dated Feb. 21, 2012 in U.S. Appl. No. 12/363,676, 4 pages.

* cited by examiner

*Primary Examiner* — Michael Barr
*Assistant Examiner* — Saeed T Chaudhry

(57) ABSTRACT

Methods of cleaning one or more workpieces are described. A method includes oscillating workpieces while performing a cleaning operation (e.g., sonication, rinse, etc.) and dwelling the workpieces at one or more oscillation positions (e.g., an upper oscillation position, an lower oscillation position, or an intermediate oscillation position) for corresponding one or more dwell time periods.

32 Claims, 5 Drawing Sheets

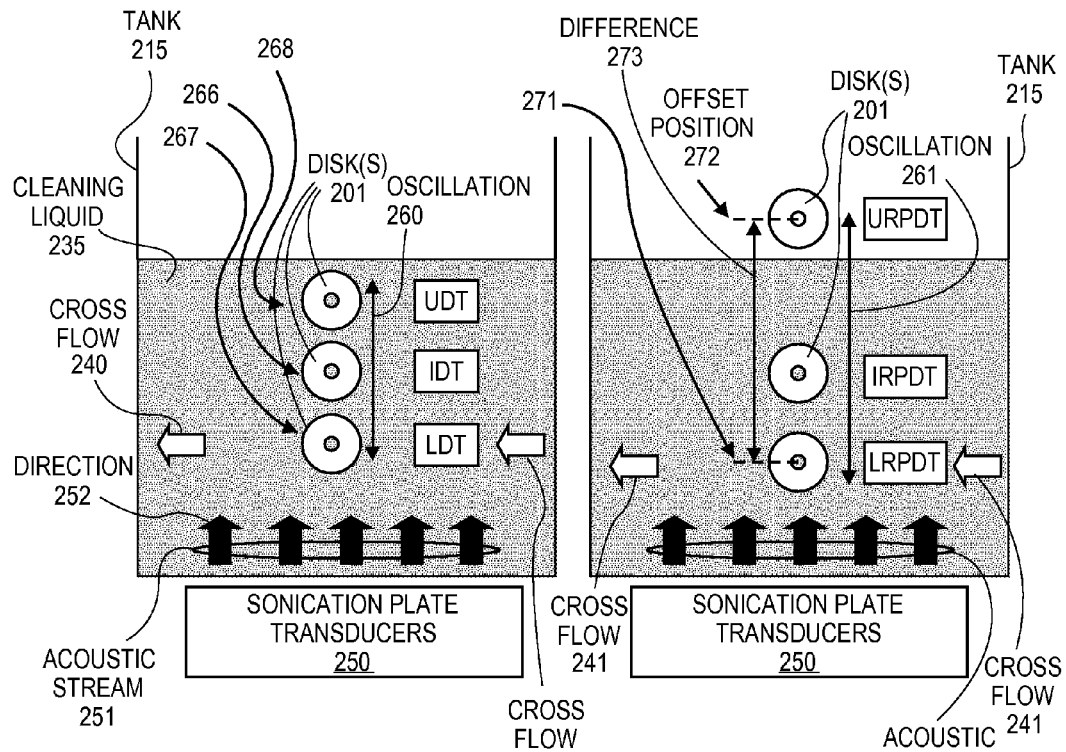
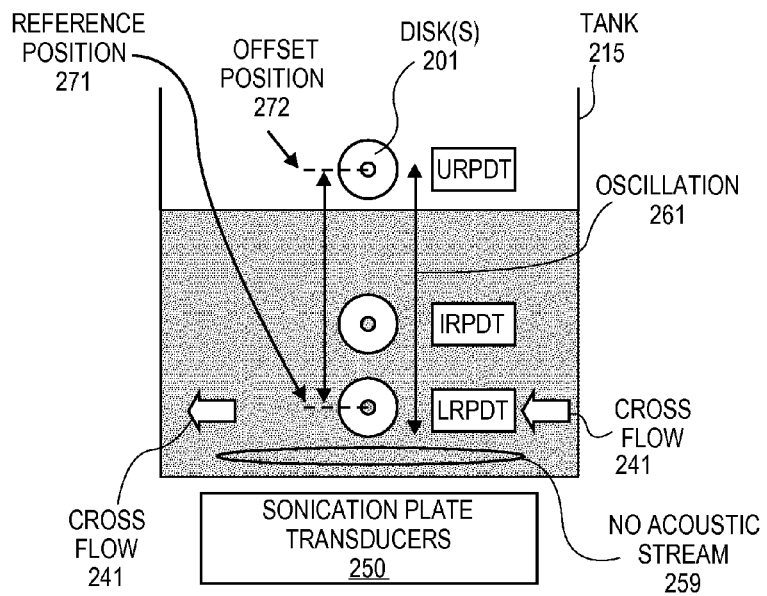
FIG. 2A   FIG. 2B   FIG. 2C

CLEANING OPERATIONS WITH DWELL TIME

TECHNICAL FIELD

Embodiments described herein relate to the field of cleaning processes, more particularly, to cleaning processes for workpieces.

BACKGROUND

During a series of magnetic recording disk manufacturing operations, a disk's surface is exposed to various types of contaminants. Any material present in a manufacturing operation is a potential source of contamination. For example, sources of contamination may include process gases, chemicals, deposition materials, and liquids. The various contaminants may be deposited on the disk's surface in particulate form. If the particulate contamination is not removed, it may interfere with the proper fabrication of a magnetic recording disk. Therefore, it is necessary to clean contamination from the surface of the disk at one or more stages in the manufacturing process, such as post sputtering.

Contamination may be removed using sonication and rinsing techniques. The function of sonication cleaning is to remove a majority of the removable particulates from the disk. The function of rinse cleaning is to further remove loose particulates while keeping the cleaning liquid cleaner than during the sonication.

Some conventional disk cleaning systems perform sonication cleaning while oscillating the disks as illustrated in FIG. 1A, which may be referred to as dynamic sonication. Other conventional disk cleaning systems perform sonication cleaning without oscillation of the disks as illustrated in FIG. 1B, which may be referred to as static sonication. With or without oscillation of the disks, the cleaning mechanism and efficiency of conventional cleaning methods could be significantly different depending on the oscillation position, the sonication power, and the cleaning liquid circulation cross flow rate.

BRIEF DESCRIPTION OF THE DRAWINGS

Embodiments are illustrated by way of example, and not limitation, in the figures of the accompanying drawings in which:

FIG. 2A illustrates a method of sonication cleaning with dwelling of disk(s) at one or more oscillation positions performed in accordance with one embodiment of the present invention.

FIG. 2B illustrates a method of rinse cleaning with dwelling of disk(s) at one or more oscillation positions performed in accordance with one embodiment of the present invention.

FIG. 2C illustrates another embodiment of the present invention in which power to sonication plate transducers may be turned off during the rinse cleaning of disk(s) while dwelling at one or more oscillation positions.

DETAILED DESCRIPTION

Embodiments of the apparatus and methods are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding. In other instances, well-known manufacturing processes and equipment have not been described in particular detail to avoid unnecessarily obscuring the claimed subject matter. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment. Furthermore, the particular features, structures, materials, or characteristics may be combined in any suitable manner in one or more embodiments.

Methods of cleaning one or more workpieces are described. A method includes oscillating workpieces while performing a cleaning operation (e.g., sonication, rinse, etc.) and dwelling the workpieces at one or more oscillation positions (e.g., an upper oscillation position, a lower oscillation position, or an intermediate oscillation position) for a corresponding one or more dwell time periods. The dwell time periods at each of the oscillation positions at which the oscillation is dwelled (i.e., a dwell position) may be the same or different. Furthermore, the dwell time periods in each of the oscillation cycles may be the same or different.

Figure 1B:
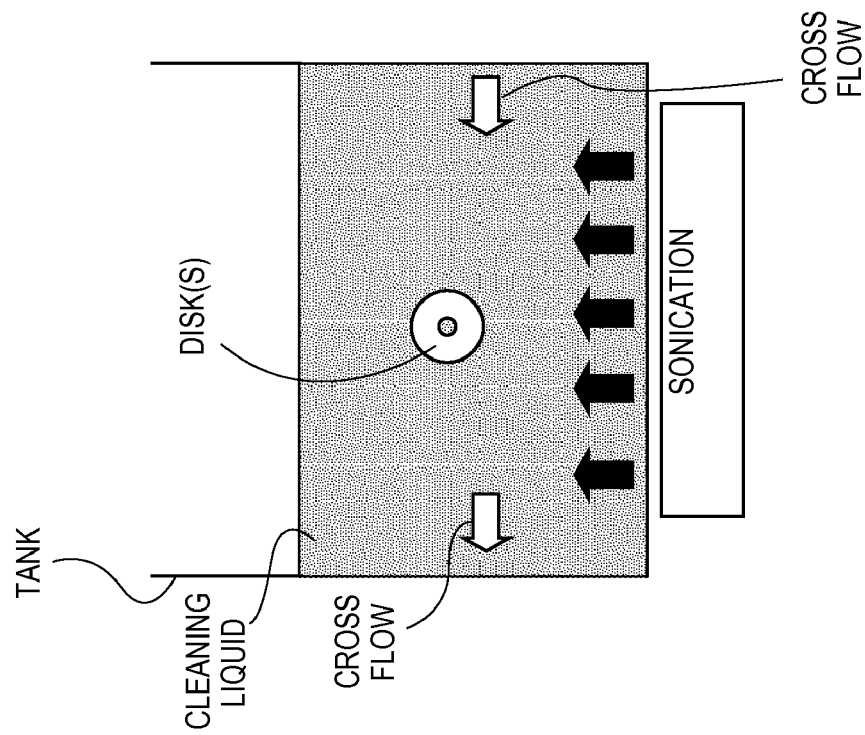
FIG. 1B illustrates a conventional static sonication cleaning operation.
Figure 1A:
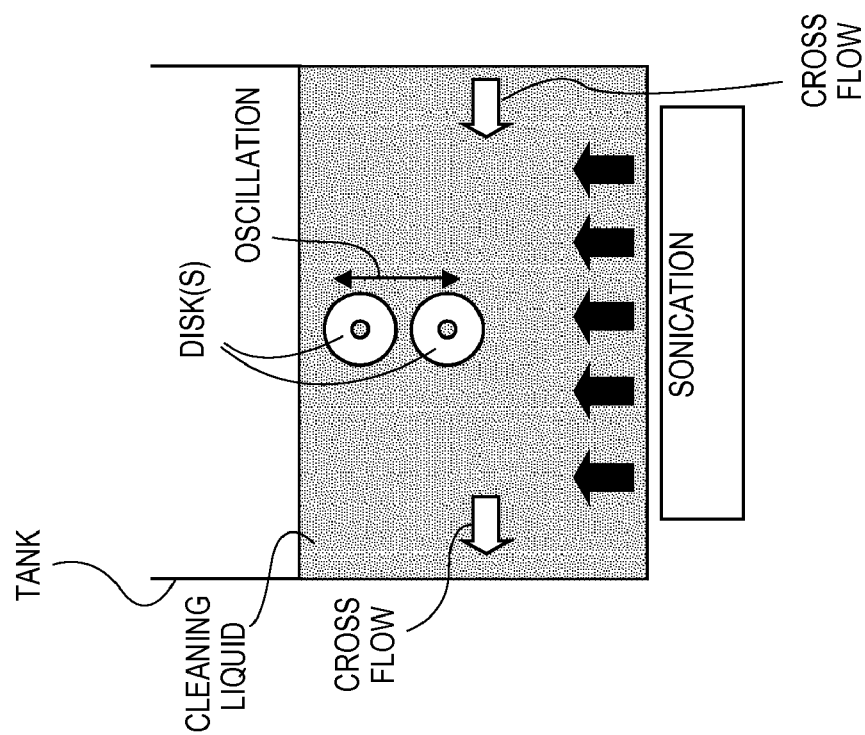
FIG. 1A illustrates a conventional dynamic sonication cleaning operation.
Figure 1C:
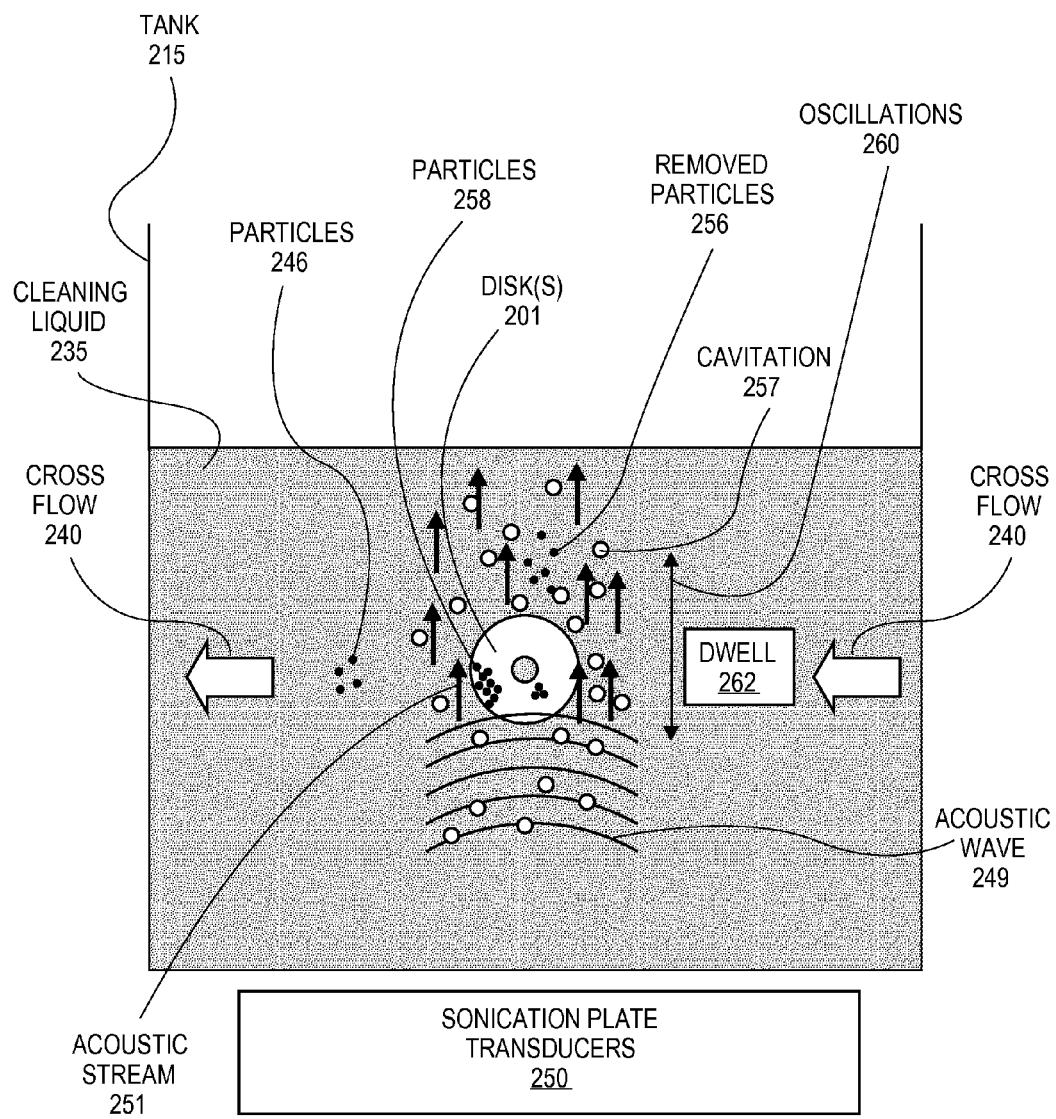
FIG. 1C illustrates a sonication cleaning method that may be utilized in accordance with embodiments of the present invention described herein.

FIG. 1C illustrates a sonication cleaning method that may be utilized in accordance with embodiments of the present invention described herein. Embodiments of the cleaning methods may be described herein at times with respect to megasonication. In megasonication cleaning, sonciation plate transducers 250 vibrate to generate acoustic waves 249 that produce a controlled acoustic stream 251 of cleaning liquid 235 in tank 215 towards disk(s) 201. The acoustic waves 249 produce cavitations 257 in the cleaning liquid 235 that move across the surface of the disk(s) 201. The cavitations 257 that are produced have sufficient energy to overcome the force of adhesion of some of the particles 258 residing on the surface of the disk(s) 201 and, thereby, remove particles 256 from the surface of the disk(s) 201. The acoustic stream 251 operates to move the removed particles 256 away from the disk(s) 201 in order to avoid the re-deposition of the particles 256 onto the surface of the disk(s) 201. The cleaning method of the present invention may also include agitation cleaning of the disk(s) 201, during sonication cleaning, by oscillations 261 of the disk(s) 201 to further facilitate removal of particles 256. In one embodiment of the present invention, as discussed in further detailed below, a circulation cross flow 240 of cleaning liquid 235 may also be used during sonication cleaning in order to yet further facilitate the removal of particles 246 from the disk(s) 201, as well as their movement away from disk(s) 201 to avoid their re-deposition on the surface of disk(s) 201.

Cleaning mechanism that may operate on the workpieces during embodiments of the cleaning methods described herein may include one or more of the following: oscillation shear force, cross flow shear force, sonication cavitations collapse, and sonication AE agitation. For example, in an embodiment that utilizes a cross flow 240 of cleaning liquid during sonication, such a cross flow 240 of cleaning liquid 235 in tank 214 may be become distorted and weaken the laminar flow strength of the cleaning liquid if the oscillation 260 velocity is too high. Yet, a stronger cross flow velocity may be desired as it could help particle removal (e.g., by shear force) and minimize particle re-deposition. Accordingly, the dwelling 262 of the workpieces at one or more of the oscillation positions according to embodiments of the present invention may enable the strength of the cross flow 240 of cleaning liquid 235 to be maintained, for its generated velocity, in order to improve both the particle removal and particle re-deposition performance (i.e., reduce particle re-deposition).

In another embodiment, a benefit of utilizing a dwell period at an oscillation dwell position (e.g., dwell position 262 of FIG. 1C) may be to allow higher sonication power at a dwell position having a stronger cleaning liquid cross flow 240. The strength of the cross flow 240 of the cleaning liquid 235 may limit the effect of the sonication power at certain oscillation positions. If the sonication acoustic stream 251 is stronger than the cross flow 240 at certain oscillation positions, the acoustic waves 249 may generate an additional sonication flow turbulence, which may degrade particle re-deposition performance. A stronger cross flow 240 of cleaning liquid enabled by a dwelling for dwell period at a dwell position (e.g., dwell position 262 of FIG. 1C) could allow higher sonication power without being in the sonication turbulence regime and, thereby, enhance particle removal efficiency. By combining the oscillation and dwell periods in one sonication cleaning cycle, the above noted four cleaning mechanisms may be optimize in accordance with one embodiment of the present invention. It should be noted that embodiments of the present invention discussed herein are not limited only to purposes of providing the exemplary benefits noted above but may also be utilized for other purposes and benefits.

FIG. 2A illustrates a method of sonication cleaning with dwelling of disk(s) at one or more oscillation positions performed in accordance with one embodiment of the present invention. Initially, the disk(s) 201 are lowered by a shuttle into tank 215 such that the disk(s) 201 are submerged in cleaning liquid 235. A cross flow 240 of the cleaning liquid 235 is established in the tank 215 in order to remove cleaning liquid particles from a vicinity of the disk(s) 201. Tank 215 is equipped with sonication plate transducers 250 that can be activated, or powered on, under the control of a programmable controller, to generate an acoustic stream 251 emanating from the bottom of tank 215 towards the disk(s) 201 in direction 252. The disk(s) 201 are also oscillated 260 during sonication, in a parallel direction to the direction 252 of the acoustic stream 251, to generate agitation cleaning of the disk(s) 201. The oscillation of the disk(s) 201 may be performed by a handler such as the one used to transport the disk(s) 201 into tank 215 or by other mechanisms (e.g., manually). The disk(s) may be oscillated at a velocity, for example, in a range of 1,000 millimeters per minute (mm/min) to 10,000 mm/min. Sonication equipment such as the plate transducers and controllers is known in the art; accordingly, a more detailed discussion is not provided.

In the sonication cleaning operation illustrated in FIG. 2A, the oscillation 260 of the disk(s) 201 may be temporarily halted such that the movement of disk(s) 201 is dwelled at one or more oscillation positions (i.e., dwell positions) within the oscillation cycle of movement. For example, the movement of disk(s) 201 may be dwelled at, for example, upper oscillation position 268, lower oscillation 267, or an intermediate oscillation position 266, or a combination thereof in order to improve the efficiency of the sonication cleaning performed in the tank 215. Certain cleaning tank systems, for example, may have different, or non-uniform, cleaning liquid 235 circulation cross flow 240 rates from the bottom of the tank 215 to the top of the cleaning liquid level in tank 215 due to limitations in the equipment that is used to generate the cross flows in tank 215. Such non-uniform cross flow rates in combination with the distance between upper and lower oscillation positions (e.g., upwards of 45 millimeters) may result in less particulate removal than would otherwise be desired. For example, a reduction in the cross flow rate of cleaning liquid near the upper part of the oscillation path of the disk(s) 201 may result in less amounts of particulate being removed from the disk(s) 201.

Thus, one method embodiment of the present invention includes dwelling at a lower oscillation position 267 for a lower dwell time (LDT) period in order to remove more particulates that may not otherwise be removed at the upper oscillation position 268 due to the reduced cross flow of cleaning liquid at position 268. In a further embodiment, the lower oscillation position 267 in one oscillation cycle may be different than the lower oscillation position used in another cycle. In addition, the other oscillation positions may also be different in different cycles.

In alternative embodiments, the movement of disk(s) 201 during oscillation 260 may be dwelled for other reasons, at other oscillation positions and also at multiple oscillation positions. In such alternative embodiments, the movement of disk(s) 201 during oscillation 260 may be dwelled at upper oscillation position 268 for an upper position dwell time (UDT) or at any intermediate oscillation position 266 for an intermediate position dwell time (IDT). In exemplary embodiments, for example, the upper dwell time period may be in a range of 1 to 3 seconds, the lower dwell time period may be in a range of 0 to 2 seconds, and wherein the intermediate dwell time period is in a range of 0.5 to 2.5 seconds. In one exemplary embodiment, the ratio of time between the moving of disks(s) 201 and the total dwelling time of disks 201 at any of the dwell positions during the oscillation 260 may be approximately 1:1. It should be noted that the dwell times and ratio provided above are only exemplary and that other dwell times and ratios may be used.

It should also be noted that the various parameters discussed herein (e.g., dwell times, oscillation positions, oscillation velocities, and sonication power) may be varied within a cycle and among the oscillation cycles. In one embodiment, the dwell time periods may be the same or varied from one oscillation cycle to another oscillation cycle. In one another embodiment, the sonication power that is used at the different oscillation positions, and when moving among the oscillation positions, may also be varied within a cycle and also among the oscillation cycles. For example, disk(s) 201 may be sonicated at the lower oscillation position 267 at a different sonication power than at the upper oscillation position 268. In yet another embodiment, the sonication power during movement of the disk(s) 201 among the different oscillation positions at which the disk(s) are dwelled is lower than the sonication power used when the disk(s) are at one or more of the dwell positions. In an exemplary embodiment, the sonication power during movement of the disk(s) during oscillation 260 is in a range of 0 to 400 watts and the sonication power at one or more of the dwell positions (e.g., 266, 267, 268) is in a range of 100 to 800 watts. Alternatively, other power settings for the sonication plate transducers 250 may be used at the various oscillation dwell positions.

FIG. 2B illustrates a method of rinse cleaning with dwelling of disk(s) at one or more oscillation positions performed in accordance with one embodiment of the present invention. After the disk(s) 201 are sonicated as discussed above in relation to FIG. 2A, the disk(s) 201 may undergo a rinse cleaning operation. The rinse cleaning operation may be performed in the same tank as was used for sonication or, alternatively, may be performed in a different tank. Accordingly, tank 215 of FIG. 2B may either be the same tank 215 as was used to perform the sonication cleaning described in relation to FIG. 2A or may be a separate tank in which rinsing is performed.

During rinsing, a cross flow 241 of the cleaning liquid 235 may be generated in the tank 215 while the disk(s) 201 are further oscillated 261 in a manner that removes at least a portion of the disk(s) 201 from submersion in the cleaning liquid 235. The cross flow 241 of cleaning liquid 235 is perpendicular to the direction of oscillating 261. The cross flow 241 during the rinse cleaning of FIG. 2B may be set to have the same velocity as the cross flow 240 during the sonication cleaning of FIG. 2A or may be set to lower velocity to reduce dispersal of particulates in the cleaning solution. As an example, the cross flows 240 and 241 of the cleaning liquid 235 in either cleaning modes may have a velocity in a range of 5 to 30 millimeters per second. Alternatively, no cross flow or other configurations of flow of cleaning liquid 235 may be used during rinse cleaning of the disk(s) 201.

Before initiating further oscillation 261 during the rinse cleaning, the disk(s) 201 may be positioned at a lower oscillation, or reference position 271 such that they are completely submerged in the cleaning liquid 235. During further oscillation 261, the disk(s) 201 may be moved to an upper oscillation, or offset, position 272. In one embodiment, the offset position 272 may be set such that the disk(s) 201 are completely removed from submersion in the cleaning liquid 235 as illustrated in FIG. 2B. Alternatively, the offset position 272 may be set such that the disk(s) 201 are only partially removed from submersion in the cleaning liquid 235. Using such an offset method may prevent the need for changing the cleaning system's default reference or starting points (which may also be referred to as a teach point). In one embodiment, the initial reference position 271 may correspond with the lower oscillation position 267 at which the disk(s) are oscillated 260 during the sonication illustrated in FIG. 2A. However, alternatively, the reference position 271 may be set to a different position.

When the same tank 215 is used for multiple cleaning operations and is switched from a sonication mode to a rinse mode of operation (e.g., by PLC 360 of FIG. 3), a higher, upper oscillation position may be set for the disk(s) 201 to the desired offset position 272 for rinsing to enable the disk(s) to be lifted at least partially above the surface of the cleaning liquid 235. The difference 273 between the offset position 272 and the reference position 271 may be in a range of 80 to 100 millimeters. Alternatively, other difference distances may be used. It should also be noted that the disk(s) 201 may be oscillated at either the same or a different velocity when moved toward the offset position 272 than when moved toward to the reference position 271. In one embodiment, for example, the disk(s) 201 are oscillated at a slower velocity when moved toward the reference position 271 than when moved toward the offset position 272.

Moreover, the disk(s) 201 may be oscillated during rinsing at the same velocity of oscillation as during sonication. In one embodiment, the further oscillation of the disk(s) 201 during the rinsing of FIG. 2B may be at a lower velocity than during the sonication of FIG. 2A, for example, at a velocity in a range of 1,000 to 3,000 millimeters per minute (mm/min). Alternatively, the disk(s) may be further oscillated during rinsing at the same or greater velocity of oscillation than during sonication cleaning of FIG. 2A.

In the rinsing embodiment illustrated in FIG. 2B, the sonication plate transducers 250 may be maintained powered on to continue the acoustic stream 251 either at a same power setting as used during the sonication cleaning of FIG. 2A or at a reduced power via a programmable controller. Furthermore, the sonication power settings may be different when the disk(s) 201 are at the upper and lower oscillation positions. In one embodiment, the sonication power at the reference position 271 may be in a range of 100 to 600 watts and, the sonication power at the offset position 272 may be in range of 0 to 300 watts. Alternatively, other power settings may be used. In another embodiment, power to the sonication plate transducers 250 may be turned off during the rinse cleaning of disk(s) such that no acoustic stream is generated 259 as illustrated in FIG. 2C.

In an exemplary embodiment, the relationship between the dwell times URPDT, IRPDT and LRPDT at the upper, intermediate and lower subsequent oscillation positions, respectively, during the rinse cleaning illustrated of FIG. 2B may be different than the dwell times (UDT, IDT, and LDT) during the sonication cleaning of FIG. 2A. In particular, if rinse cleaning is performed in a different tank than used for sonication, the cleaning liquid 235 in the tank during rinsing may be set to have a lower cross flow 241 velocity than during sonication. If so, it may be desired to dwell longer at the lower oscillation position in the sonication tank (e.g., having a greater cross flow velocity and higher sonication power to remove more particulate) and then dwell less at the lower subsequent oscillation positions during rinsing in order to avoid re-deposition of particulate on disk(s) 201. In one embodiment, the ratio of time between moving the disk(s) 201 among the dwell positions and the total dwelling time (e.g., URPDT+IRPDT+LRPDT) at the various dwelling positions during rinsing is approximately 3:1.

It should be noted that certain mechanical components such as a shuttle and a handler that hold and oscillate the disk(s) are not illustrated in the above described FIGS. 2A-2C so as not to obscure an illustration of the described methods but, rather, are illustrated in the cleaning system of FIG. 3, discussed below.

Figure 3:
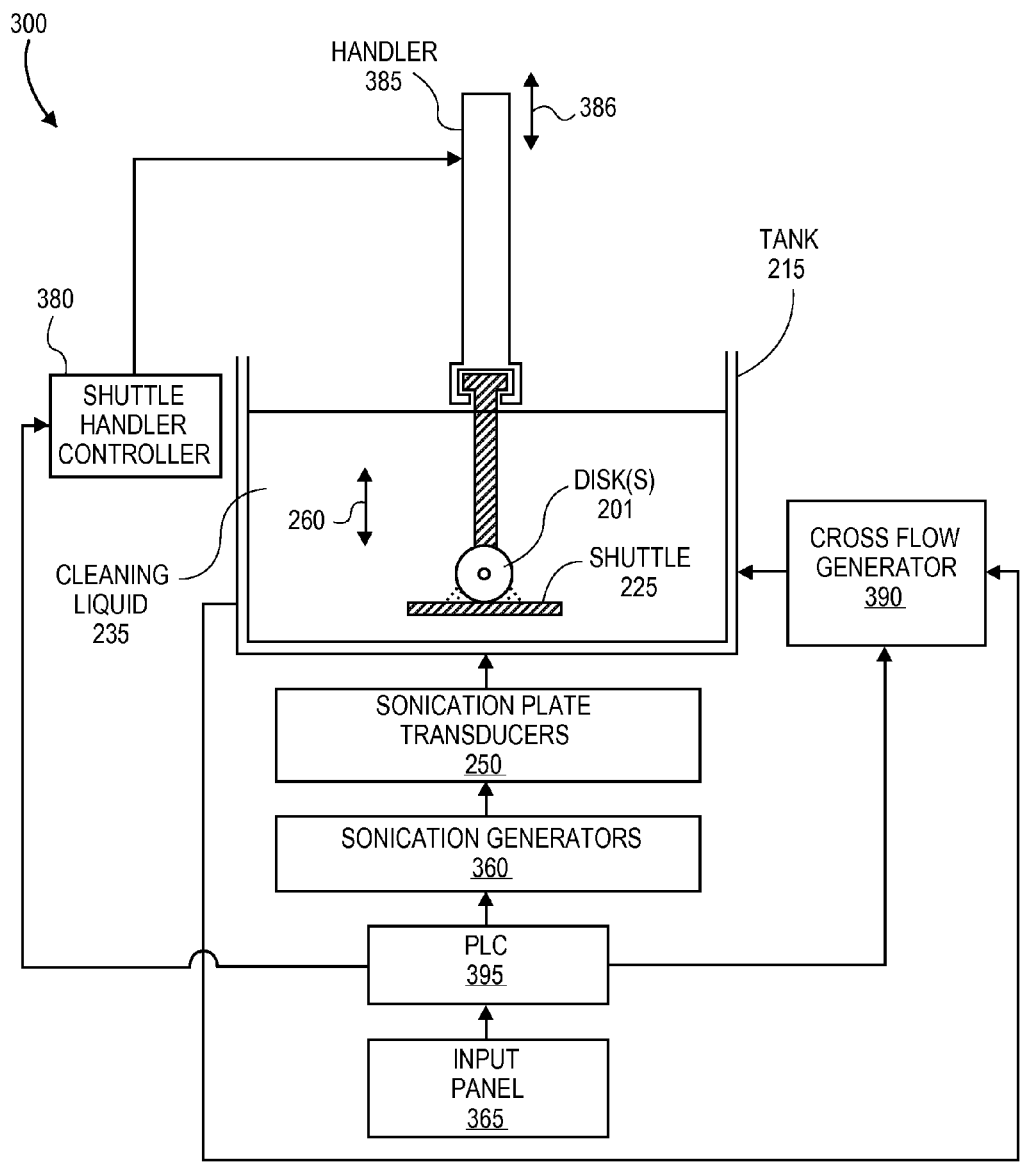
FIG. 3 is a block diagram illustrating a cleaning control system according to one embodiment of the present invention.

FIG. 3 is a block diagram illustrating a cleaning control system 300 according to one embodiment of the present invention. As depicted, a system controller, such as programmable logic controller (PLC) 395 is used to control the operation of the various subsystem controllers, generators, and components. The PLC 395 is coupled to sonication generator 360 to control the operation (e.g., power settings and frequencies) of sonication plate transducers 250 through a user input panel 365. In one particular embodiment, the sonication may be performed at a cavitations frequency in a range of 120 to 950 kHz. In one particular embodiment, the sonication may have a power setting in a range of 100 to 800 watts. It should be noted that power and frequencies provide herein are only exemplary and may have other values in alternative embodiments.

A user may program the PLC 360, through input panel 365, with different power settings at different stages of the cleaning operations discussed above. The sonication plate transducers 250, under control of PLC 395, generate an acoustic stream in the cleaning liquid 235 of tank 215. It should be noted that the same PLC 395 may be coupled to the sonication plate transducers of both the first cleaning tank 410 and second cleaning tank 420 of FIG. 4 discusses below. Alternatively, each of the first and second cleaning tanks may have their own respective PLCs.

The cleaning control system 300 also includes a shuttle handler controller 380 coupled to handler 385 which, in turn, is coupled to disk(s) 201 carrying shuttle 225. The shuttle handler controller 380 controls the submersion and removal 386 of disk(s) into tank 215 and the transfer of the shuttle 225 between tanks (e.g., tanks 410 and 420 of FIG. 4). The shuttle handler controller 380 also controls the oscillation 260 and dwelling of the disk(s) 201 during either sonication or rinse cleaning operations.

The cleaning control system 300 also includes a cross flow generator 390 to generate a cross flow of cleaning liquid 235 within tank 215 as discussed above. The cross flow generator 390 includes components to generate cross the cross flows of cleaning liquid described above, for example, a pump to drive the cross flows of cleaning liquid, a valve to control the flow rates, and perforated side panels on tank 215 designed to control the desired laminar cross flow.

Shuttle handler controllers, cross flow generators, PLCs and sonication plate transducers are known to those of ordinary skill in the art; accordingly, further details are not provided herein. The various components for the cleaning systems are commercially available, for example, the PLC may be obtained from Controls Technology (CTC) or Mitsubishi; the sonication plate transducers and generator may be obtained from Branson or Crest; the shuttle handler and controller may be obtained from Star Linear System; and the cross flow generator and tank may be obtained from Speed-Fam Corp.

Figure 4:
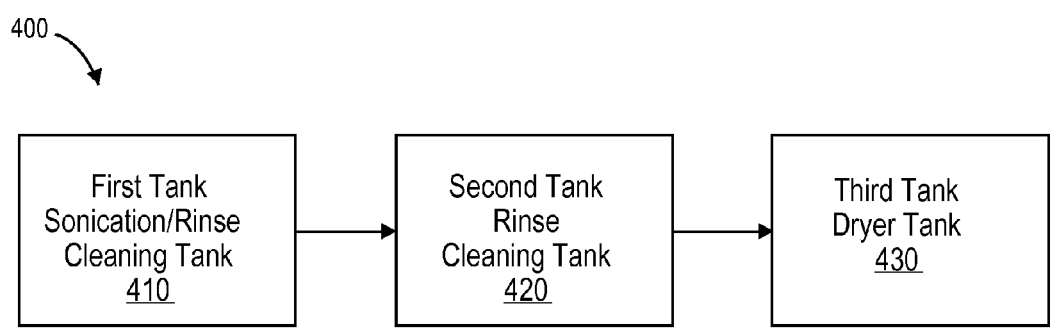
FIG. 4 illustrates a cleaning system that may utilize one or more cleaning tanks and methods according to embodiments of the present invention.

FIG. 4 illustrates a cleaning system that may utilize one or more cleaning tanks and methods according to embodiments of the present invention. The cleaning system 400 of FIG. 4 includes a first cleaning tank 410 in which either sonication cleaning alone may be performed or both sonication cleaning and rinse cleaning operations are combined. The cleaning system 400 also includes a second tank 420 in which rinse cleaning may be performed. In one embodiment of the present invention, the use of a cross flow (e.g., 240, 241) of cleaning liquid 235 in either tank 410 or 420 may be used during rinse cleaning of the disk(s) 201. Alternatively, a cross flow of cleaning liquid 235 may not be used during rinse cleaning of disk(s) 201.

Since wet cleaning of disks may also require subsequent drying, the cleaning system 400 of FIG. 4 may also include a dryer tank 430. Although drying operations may not necessarily be a part of embodiments of the present invention, such is provided as a context for discussion of the sonication and rinse tanks. A shuttle may be used to hold the disks during the cleaning operations and while the disks are carried to and from the tanks illustrated in FIG. 4 by a disk transport mechanism as discussed above.

It should be noted that the sonication energy applied to the cleaning liquid as described by the methods herein may be applied by any one of other various techniques including, for example, ultrasonication (i.e., a lower frequency sonication than megasonication), or other acoustic energy generation mechanisms that generate cavitations such as the sonication plate transducers discussed herein. A difference between ultrasonic cleaning and megasonics cleaning lies in the frequency that is used to generate the acoustic waves. Ultrasonic cleaning uses lower frequencies and, thereby, produces more random cavitations. Megasonics cleaning uses higher frequencies (e.g., on the order of several hundred to several thousand kHz in contrast with frequencies on the order of less than several hundred kHz for ultrasonics) and, thereby, produces more controlled cavitations. It should be noted that the megasonic and ultrasonic frequency ranges provided above are only examples and that those of ordinary skill in the art may consider megasonication or ultrasonic to have different frequencies than those noted above. In one exemplary embodiment, a Branson ultrasonic generator may be used for sonication cleaning methods discussed herein.

In one embodiment, the cleaning methods described herein may be utilized for post sputter wet cleaning (PSC) of magnetic recording disks. In an embodiment where the cleaning operations are performed on a magnetic recording disk as part of a PSC module, the magnetic recording disk includes a magnetic recording layer deposited above a substrate. The magnetic layer may be of any known composition, such as a cobalt (Co) alloy. The magnetic layer may be formed on both sides of magnetic recording disk substrate to form a double-sided magnetic recording disk. Alternatively, a single sided magnetic recording disk may be formed. In an alternate embodiment where the cleaning operations are performed as part of a pre-sputter wet cleaning, the magnetic recording disk substrate may be, for example, a glass material, a metal, and/or a metal alloy material. Glass substrates that may be used include, for example, silica containing glass such as borosilicate glass and aluminosilicate glass. Metal and metal alloy substrates that may be used include, for example, aluminum (Al) and aluminum magnesium (AlMg) substrates, respectively. The magnetic recording disk substrate may also be plated with a nickel phosphorous (NiP) layer. Alternatively, the cleaning methods described herein may be used in other pre or post fabrication operation cleans of partially or fully fabricated magnetic recording disks.

Embodiments of cleaning methods are described with respect to magnetic recording disks. It should be appreciated that the embodiments of cleaning methods described herein may be applied to disks that vary in size or shape, for the production of different size disks. Embodiments of cleaning methods described herein may also be used for the cleaning of semiconductor wafers or other types of workpieces. The term "workpiece" as used herein may include, substrates, semiconductor wafers, photomasks, magnetic recording disks, optical discs, glass substrates, flat panel display surfaces, liquid crystal display surfaces, etc.

Although these embodiments have been described in language specific to structural features and methodological acts, it is to be understood that the invention defined in the appended claims is not necessarily limited to the specific features or acts described in particular embodiments. The specific features and acts disclosed are to be understood as particularly graceful implementations of the claimed invention in an effort to illustrate rather than limit the present invention.

What is claimed is:
1. A method, comprising:
  sonicating one or more workpieces within a first cleaning tank having a cleaning liquid, wherein sonicating comprises generating an acoustic stream in a direction towards the one or more workpieces to produce cavitations cleaning of the one or more workpieces; and
  oscillating, during the sonicating, the one or more workpieces in the first cleaning tank between an upper oscillation position and a lower oscillation position, wherein the oscillating comprises one or more oscillation cycles, the method in a first one of the oscillation cycles further comprising:

moving the one or more workpieces to a dwell position; and dwelling at the dwell position for a dwell time period beyond a time required to change a direction of moving the one or more workpieces during the oscillating.

2. The method of claim 1, wherein the dwell position is an upper oscillation position.

3. The method of claim 1, wherein the dwell position is a lower oscillation position.

4. The method of claim 1, wherein the dwell position is an intermediate oscillation position.

5. The method of claim 1, wherein the dwell position is the upper oscillation position and the dwell time period is an upper dwell time period, and wherein the method in the first one of the oscillation cycles further comprises:

moving the one or more workpieces to the lower oscillation position; and dwelling at the lower oscillation position for a lower dwell time period.

6. The method of claim 5, wherein the method in the first one of the oscillation cycles further comprises:

moving the one or more workpieces to an intermediate oscillation position; and dwelling at the intermediate oscillation position for an intermediate dwell time period.

7. The method of claim 5, wherein the lower dwell time period at the lower oscillation position is less than the upper dwell time period at the upper oscillation position.

8. The method of claim 7, wherein the upper dwell time period is in a range of 1 to 3 seconds.

9. The method of claim 8, wherein the lower dwell time period is in a range of 0 to 2 seconds.

10. The method of claim 8, wherein the intermediate dwell time period is in a range of 0.5 to 2.5 seconds.

11. The method of claim 5, wherein the first cleaning tank has:

a first cross flow, relative to the direction of the acoustic stream, of the cleaning liquid around the lower oscillation position during sonicating, and a second cross flow of the cleaning liquid around the upper oscillation position during sonicating.

12. The method of claim 11, wherein the first cross flow of cleaning liquid around the lower oscillation position has a lower velocity than a velocity of the second cross flow of cleaning liquid around the upper oscillation position.

13. The method of claim 5, wherein a distance between the lower oscillation position and the upper oscillation position is in a range greater than zero to 45 millimeters.

14. The method of claim 5, wherein the one or more workpieces are at least partially fabricated magnetic recording disks.

15. The method of claim 5, wherein the upper oscillation positions in each of the oscillation cycles are the same.

16. The method of claim 5, wherein the upper oscillation position in one of the oscillation cycles is different than the upper oscillation position in another of the oscillation cycles.

17. The method of claim 5, wherein the lower oscillation positions in each of the oscillation cycles are the same.

18. The method of claim 5, wherein the lower oscillation position in one of the oscillation cycles is different than the lower oscillation position in another of the oscillation cycles.

19. The method of claim 5, wherein one or more workpieces are sonicated at the lower oscillation position at a different sonication power than at the upper oscillation position.

20. The method of claim 1, wherein the one or more workpieces are oscillated in a parallel direction to the acoustic stream and wherein the one or more workpieces are oriented within the first cleaning tank in the parallel direction to the acoustic stream.

21. The method of claim 1, wherein the one or more oscillation cycles have a velocity in a range of a range of 1,000 millimeters per minute (mm/min) to 10,000 mm/min.

22. The method of claim 1, wherein a first ratio of time between the moving steps and the dwelling steps in the first cleaning tank is approximately 1:1.

23. The method of claim 1, wherein the one or more workpieces are at least partially fabricated magnetic recording disks.

24. The method of claim 1, wherein a sonication power during the moving is lower than sonication power at the dwell position.

25. The method of claim 24, wherein the sonication power during the moving is in a range of 0 to 400 watts and the sonication power at the dwell position is in a range of 100 to 800 watts.

26. The method of claim 24, wherein one or more of the sonication power during moving, the sonication power at the dwell position, and the dwell time period is different in a second one of the oscillation cycles than in the first one of the oscillation cycles.

27. The method of claim 1, wherein the dwell time period in a subsequent one of the oscillation cycles is less than the dwell time period in the first one of the oscillation cycles.

28. A method, comprising:

sonicating one or more workpieces within a first cleaning tank having a cleaning liquid, wherein sonicating comprises generating an acoustic stream in a direction towards the one or more workpieces to produce cavitations cleaning of the one or more workpieces; and oscillating, during the sonicating, the one or more workpieces in the first cleaning tank between an upper oscillation position and a lower oscillation position, wherein the oscillating comprises one or more oscillation cycles, the method in a first one of the oscillation cycles further comprising:

moving the one or more workpieces to a dwell position;

dwelling at the dwell position for a dwell time period, wherein the dwell position is the upper oscillation position and the dwell time period is an upper dwell time period;

moving the one or more workpieces to the lower oscillation position; and dwelling at the lower oscillation position for a lower dwell time period;

rinsing the one or more workpieces in the first cleaning tank by further oscillating the one or more workpieces in the first cleaning tank between an upper further oscillation position and a lower further oscillation position, wherein the further oscillating comprises:

moving the one or more workpieces to the upper further oscillation position at which at least a portion of the one or more workpieces is extracted from submersion in the cleaning liquid;

dwelling at the upper further oscillation position for an upper rinse position dwell time period;

moving the one or more workpieces to the lower further oscillation position at which the one or more workpieces are fully submerged in the cleaning liquid; and dwelling at the lower further oscillation position for a lower rinse position dwell time period.

29. The method of claim 28, wherein the one or more workpieces at the upper further oscillation position are fully extracted from submersion in the cleaning liquid and the sonicating is stopped while at the upper oscillation position, and wherein the upper rinse position dwell time period is greater than the lower rinse position dwell time period.

30. A method, comprising:
sonicating one or more workpieces within a first cleaning tank having a cleaning liquid, wherein sonicating comprises generating an acoustic stream in a direction towards the one or more workpieces to produce cavitations cleaning of the one or more workpieces; and
oscillating, during the sonicating, the one or more workpieces in the first cleaning tank between an upper oscillation position and a lower oscillation position, wherein the oscillating comprises one or more oscillation cycles, the method in a first one of the oscillation cycles further comprising:
moving the one or more workpieces to a dwell position;
dwelling at the dwell position for a dwell time period, wherein the dwell position is the upper oscillation position and the dwell time period is an upper dwell time period;
moving the one or more workpieces to the lower oscillation position; and
dwelling at the lower oscillation position for a lower dwell time period;
rinsing the one or more workpieces in a second cleaning tank by subsequently oscillating the one or more workpieces in the second cleaning tank between an upper subsequent oscillation position and a lower subsequent oscillation position, wherein the subsequent oscillating comprises:
moving the one or more workpieces to the upper subsequent oscillation position at which at least a portion of the one or more workpieces is extracted from submersion in the cleaning liquid;
dwelling at the upper subsequent oscillation position for an upper rinse dwell time period;
moving the one or more workpieces to the lower subsequent oscillation position at which the one or more workpieces are fully submerged in the cleaning liquid; and
dwelling at the lower subsequent oscillation position for a lower rinse dwell time period.

31. The method of claim 30, wherein the one or more workpieces at the upper oscillation position are fully extracted from submersion in the cleaning liquid and the sonicating is stopped while at the upper oscillation position, and wherein the upper rinse position dwell time period is greater than the lower rinse position dwell time period.

32. The method of claim 30, wherein a second ratio of time between the moving steps and the dwelling steps in the second cleaning tank is approximately 3:1.

* * * * *